United States Patent
Miller et al.

(10) Patent No.: US 7,719,015 B2
(45) Date of Patent: May 18, 2010

(54) TYPE II BROADBAND OR POLYCHROMATIC LED'S

(75) Inventors: Thomas J. Miller, Woodbury, MN (US); Michael A. Haase, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 507 days.

(21) Appl. No.: 11/009,218

(22) Filed: Dec. 9, 2004

(65) Prior Publication Data

US 2006/0124938 A1    Jun. 15, 2006

(51) Int. Cl.
   *H01L 33/00*    (2006.01)
(52) U.S. Cl. .................. 257/94; 257/103; 257/E33.008
(58) Field of Classification Search .............. 257/94, 257/103, E33.008, E33.016, E33.048
   See application file for complete search history.

(56) References Cited

U.S. PATENT DOCUMENTS

| | | | |
|---|---|---|---|
| 4,527,179 A | | 7/1985 | Yamazaki |
| 4,570,172 A | | 2/1986 | Henry et al. |
| 4,688,068 A | | 8/1987 | Chaffin et al. |
| 5,646,419 A | * | 7/1997 | McCaldin et al. ............ 257/13 |
| 5,751,014 A | * | 5/1998 | Nakatsu et al. ............... 257/25 |
| 5,851,905 A | | 12/1998 | McIntosh et al. |
| 5,889,295 A | | 3/1999 | Rennie et al. |
| 5,900,642 A | | 5/1999 | Nakatsu et al. |
| 5,998,925 A | | 12/1999 | Shimizu et al. |
| 6,147,365 A | | 11/2000 | Fischer et al. |

(Continued)

FOREIGN PATENT DOCUMENTS

EP    1 363 335    11/2003

(Continued)

OTHER PUBLICATIONS

Damilano et al., "Monolithic White Light Emitting Diodes Based on InGaN/GaN Multiple-Quantum Wells", Japanese Journal of Applied Physics, vol. 40, No. 9, Sep. 15, 2001, pp. L918-L920.

(Continued)

*Primary Examiner*—Wai-Sing Louie
(74) *Attorney, Agent, or Firm*—Robert S. Moshrefzadeh

(57) ABSTRACT

An LED is provided comprising two or more light-emitting Type II interfaces wherein at least two of the Type II interfaces differ in transition energy by at least 5%, or more typically by at least 10%, and wherein at least one of the Type II interfaces is within a pn junction. Alternately, an LED is provided comprising two or more light-emitting Type II interfaces wherein at least two of the Type II interfaces differ in transition energy by at least 5%, or more typically by at least 10%. The Type II interfaces may include interfaces from a layer which is an electron quantum well and not a hole quantum well, interfaces to a layer which is a hole quantum well and not an electron quantum well; and interfaces that satisfy both conditions simultaneously. The Type II interfaces may be within a pn or pin junction or not within a pn or pin junction. In the later case, emission from the Type II interfaces may be photopumped by a nearby light source. The LED may be a white or near-white light LED. In addition, graphic display devices and illumination devices comprising the semiconductor device according to the present invention are provided.

36 Claims, 2 Drawing Sheets

U.S. PATENT DOCUMENTS

| | | | |
|---|---|---|---|
| 6,214,116 | B1 | 4/2001 | Shin |
| 6,265,734 | B1 | 7/2001 | Fischer et al. |
| 6,303,404 | B1 | 10/2001 | Moon et al. |
| 6,337,536 | B1 | 1/2002 | Matsubara et al. |
| 6,372,536 | B1 | 4/2002 | Fischer et al. |
| 6,504,171 | B1 | 1/2003 | Grillot et al. |
| 6,548,834 | B2 | 4/2003 | Sugawara et al. |
| 6,734,467 | B2 | 5/2004 | Schlereth et al. |
| 6,825,498 | B2 | 11/2004 | Lai et al. |
| 6,837,605 | B2 | 1/2005 | Reill |
| 7,064,354 | B2 | 6/2006 | Chen |
| 7,075,116 | B2 | 7/2006 | Okazaki |
| 7,119,487 | B2 * | 10/2006 | Ikeda ............ 313/498 |
| 7,126,160 | B2 | 10/2006 | Sun et al. |
| 7,129,526 | B2 | 10/2006 | Fujiwara |
| 7,141,445 | B2 | 11/2006 | Sugawara et al. |
| 7,223,998 | B2 | 5/2007 | Schwach et al. |
| 7,247,884 | B2 | 7/2007 | Shibata et al. |
| 7,402,831 | B2 | 7/2008 | Miller et al. |
| 2001/0042861 | A1 | 11/2001 | Kano |
| 2002/0041148 | A1 | 4/2002 | Cho et al. |
| 2002/0134989 | A1 | 9/2002 | Yao et al. |
| 2002/0139984 | A1 | 10/2002 | Sugawara et al. |
| 2002/0167014 | A1 | 11/2002 | Schlereth et al. |
| 2003/0006430 | A1 | 1/2003 | Shibata et al. |
| 2003/0026306 | A1 * | 2/2003 | Ohkubo et al. ............ 372/43 |
| 2003/0161369 | A1 * | 8/2003 | Chang et al. ............ 372/45 |
| 2004/0056256 | A1 | 3/2004 | Bokor et al. |
| 2004/0061102 | A1 | 4/2004 | Tansu et al. |
| 2006/0076883 | A1 | 4/2006 | Himaki et al. |
| 2006/0081858 | A1 | 4/2006 | Lin et al. |

FOREIGN PATENT DOCUMENTS

| | | |
|---|---|---|
| EP | 1 381 091 | 1/2004 |
| EP | 1 469 516 | 10/2004 |
| JP | 11-274558 | 10/1999 |
| JP | 2004-072047 | 3/2004 |
| WO | 00/76005 | 12/2000 |
| WO | 01/66997 | 9/2001 |
| WO | 02/097902 | 12/2002 |

OTHER PUBLICATIONS

Yamada et al., "Phosphor Free High-Luminous-Efficiency White Light-Emitting Diodes Composed of InGaN Multi-Quantum Well", Japanese Journal of Applied Physics, vol. 41, No. 3A, Mar. 1, 2002, pp. L246-L248.

Dalmasso et al., "Injection Dependence of the Electroluminescence Spectra of Phosphor Free GaN-Based White Light Emitting Diodes", Physics Status Solidi (Sa) vol. 192, No. 1, Jul. 1, 2003, pp. 139-143.

Luo et al., "Patterned Three-Color ZnCdSe/ZnCdMgSe Quantum-Well Structures for Integrated Full-Color and White Light Emitters", Applied Physics Letters, vol. 77, No. 26, Dec. 25, 2000, pp. 4259-4261.

Herbert Kroemer, "Quantum Mechanics for Engineering, Materials Science and Applied Physics", (Prentice Hall, Englewood Cliffs, New Jersey), 1994, pp. 54-63.

Zory, ed., "Quantum Well Lasers", Academic Press, San Diego, California, 1993, pp. 72-79.

Reuscher et al., "ZnSe/BeTe Type-II Leds Emitting Between 640 and 515 nm", Journal of Crystal Growth, vols. 214/215, Jun. 11, 2000, pp. 1071-1074.

Chen, W. R. et al., "ZnSe-Based Mixed Color LEDs", IEEE Photonics Technology Letters, vol. 16, No. 5, May 2004, pp. 1259-1261.

Chen, W. R. et al., "ZnCdSeTe-Based Orange Light Emitting Diode", IEEE Photonics Technology Letters, vol. 14, No. 8, Aug. 2002, pp. 1061-1063.

* cited by examiner

TYPE II BROADBAND OR POLYCHROMATIC LED'S

FIELD OF THE INVENTION

This invention relates to LED's and photoluminescent devices comprising multiple Type II interfaces, typically between electron quantum wells and hole quantum wells, where the multiple Type II interfaces differ in transition energy.

BACKGROUND OF THE INVENTION

Light emitting diodes (LED's) are solid-state semiconductor devices which emit light when an electrical current is passed between anode and cathode. Conventional LED's contain a single pn junction. The pn junction may include an intermediate undoped region; this type of pn junction may also be called a pin junction. Like non-light emitting semiconductor diodes, conventional LED's pass an electrical current much more readily in one direction, i.e., in the direction where electrons are moving from the n-region to the p-region. When a current passes in the "forward" direction through the LED, electrons from the n-region recombine with holes from the p-region, generating photons of light. The light emitted by a conventional LED is monochromatic in appearance; that is, it is generated in a single narrow band of wavelengths. The wavelength of the emitted light corresponds to the energy associated with electron-hole pair recombination. In the simplest case, that energy is approximately the band gap energy of the semiconductor in which the recombination occurs.

Conventional LED's may additionally contain one or more electron/hole quantum wells at the pn junction which capture high concentrations of both electrons and holes, thereby enhancing light-producing recombination.

Several investigators have attempted to produce an LED device which emits white light, or light which appears white to the 3-color perception of the human eye.

Some investigators report the purported design or manufacture of LED's having multiple electron/hole quantum wells within the pn junction, where the multiple quantum wells are intended to emit light at different wavelengths by Type I emission. The following references may be relevant to such a technology: U.S. Pat. Nos. 5,851,905; 6,303,404; 6,504,171; 6,734,467; Damilano et al., *Monolithic White Light Emitting Diodes Based on InGaN/GaN Multiple-Quantum Wells*, Jpn. J. Appl. Phys. Vol. 40 (2001) pp. L918-L920; Yamada et al., *Phosphor Free High-Luminous-Efficiency White Light-Emitting Diodes Composed of InGaN Multi-Quantum Well*, Jpn. J. Appl. Phys. Vol. 41 (2002) pp. L246-L248; Dalmasso et al., *Injection Dependence of the Electroluminescence Spectra of Phosphor Free GaN-Based White Light Emitting Diodes*, phys. stat. sol. (a) 192, No. 1, 139-143 (2003).

Some investigators report the purported design or manufacture of LED devices which combine two conventional LED's, intended to independently emit light at different wavelengths, in a single device. The following references may be relevant to such a technology: U.S. Pat. Nos. 5,851,905; 6,734,467; U.S. Pat. Pub. No. 2002/0041148 A1; U.S. Pat. Pub. No. 2002/0134989 A1; and Luo et al., *Patterned three-color ZnCdSe/ZnCdMgSe quantum-well structures for integrated full-color and white light emitters*, App. Phys. Letters, vol. 77, no. 26, pp. 4259-4261 (2000).

Some investigators report the purported design or manufacture of LED devices which combine a conventional LED element with a chemical phosphor, such as yttrium aluminum garnet (YAG), which is intended to absorb a portion of the light emitted by the LED element and re-emit light of a longer wavelength. U.S. Pat. Nos. 5,998,925 and 6,734,467 may be relevant to such a technology.

Some investigators report the purported design or manufacture of LED's grown on a ZnSe substrate n-doped with I, Al, Cl, Br, Ga or In so as to create fluorescing centers in the substrate, which are intended to absorb a portion of the light emitted by the LED element and re-emit light of a longer wavelength. U.S. Pat. No. 6,337,536 and Japanese Pat. App. Pub. No. 2004-072047 may be relevant to such a technology.

Some investigators report the purported design or manufacture of LED's comprising Type II interfaces. U.S. Pat. Nos. 6,147,365; 6,265,734; 6,372,536; and Reuscher et al., *ZnSe/BeTe type-II LEDs emitting between 640 and 515 nm*, J. Crystal Growth 214/215, pp. 1071-1074 (2000); may be relevant to such a technology.

SUMMARY OF THE INVENTION

Briefly, the present invention provides an LED comprising two or more Type II interfaces wherein at least two of the Type II interfaces differ in transition energy by at least 5%, or more typically by at least 10%, and wherein at least one of the Type II interfaces is within a pn junction. In an alternate embodiment, an LED is provided comprising two or more light-emitting Type II interfaces wherein at least two of the Type II interfaces differ in transition energy by at least 5%, or more typically by at least 10%. In this embodiment, the Type II interfaces may be within a pn junction or not within a pn junction. In the later case, emission from the Type II interfaces may be photopumped by a nearby light source. In either embodiment, the Type II interfaces may include interfaces with layers which are electron quantum wells and not hole quantum wells, interfaces with layers which are hole quantum wells and not electron quantum wells, or interfaces that satisfy both conditions simultaneously.

In some embodiments, the Type II interfaces may include a first Type II interface which has a first transition energy corresponding to yellow, green, blue or violet wavelength visible light, and a second Type II interface which has second transition energy corresponding to red, orange or yellow wavelength visible light. In some embodiments, the Type II interfaces may include a first Type II interface which has a first transition energy corresponding to orange, yellow or green wavelength visible light, and a second Type II interface which has second transition energy corresponding to red, orange or yellow wavelength visible light and the LED may additionally comprise an LED capable of emitting green, blue or violet wavelength visible light, which optionally photopumps emission from the Type II interfaces.

In another aspect, the present invention provides a graphic display device comprising an LED according to the present invention.

In another aspect, the present invention provides an illumination device comprising an LED according to the present invention.

In this application:

with regard to a stack of layers in a semiconductor device, "immediately adjacent" means next in sequence without intervening layers, "closely adjacent" means next in sequence with few intervening layers, and "surrounding" means both before and after in sequence;

"transition energy" means electron-hole recombination energy;

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.01% different from each other, and most typically not more than 0.01% different from each other; and "pseudomorphic" means, with reference to a first crystalline layer of given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects.

It should be understood that, for any embodiment of the present invention described herein comprising n-doped and p-doped semiconductor regions, a further embodiment should be considered as disclosed herein wherein n doping is exchanged with p doping and vice-versa.

It should be understood that, where the term "quantum well" is recited herein, a single quantum well may be provided or, where practicable, multiple quantum wells, which typically share similar properties, may be provided.

It is an advantage of certain embodiments of the present invention to provide an LED device capable of emitting polychromatic, broadband, white or near-white light.

DETAILED DESCRIPTION

Figure 1:
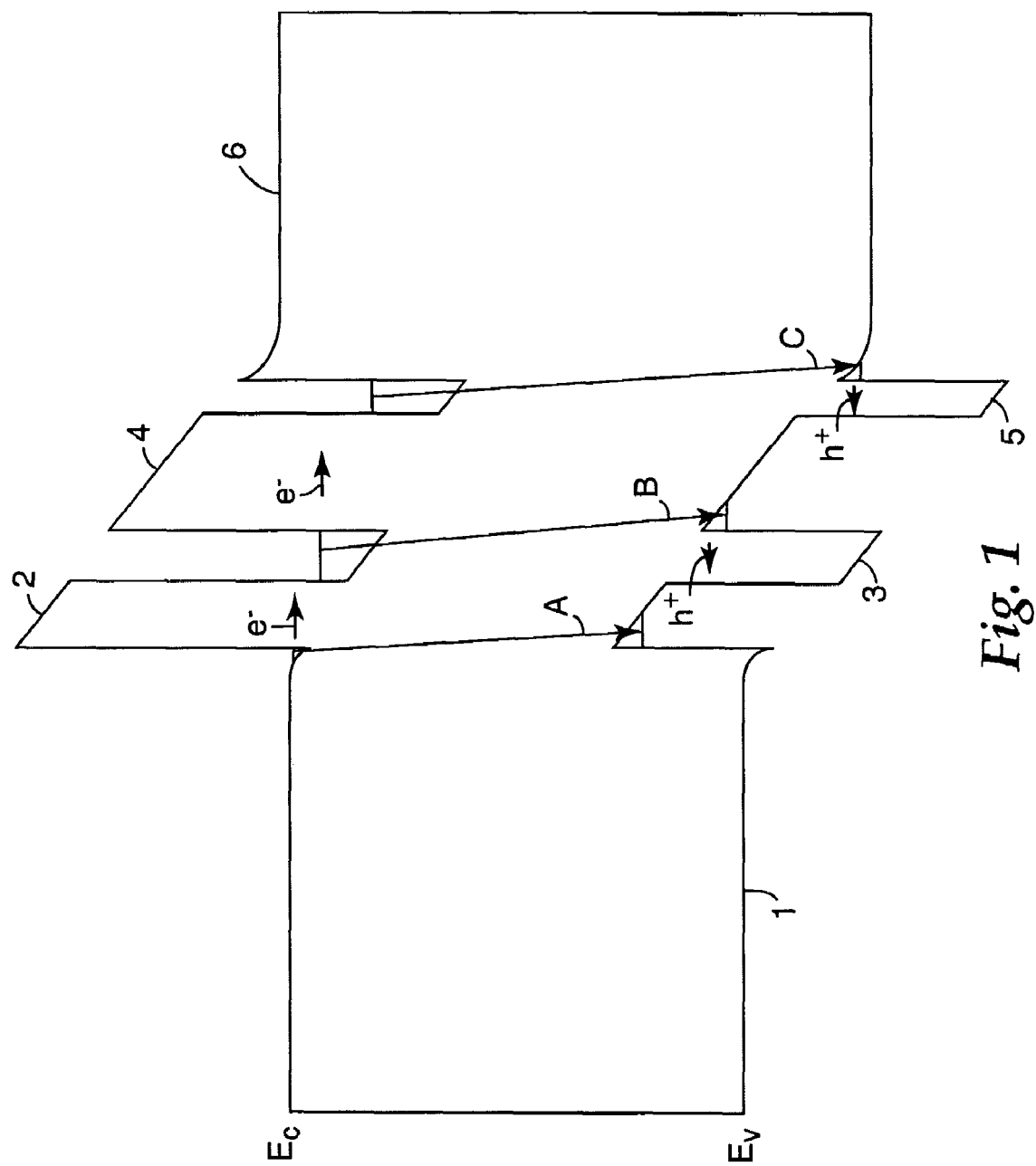
FIG. 1 is a band diagram of conduction and valence bands of semiconductors in a construction according to one embodiment of the present invention. The band diagram shows the device biased beyond "flat band" condition. Layer thickness is not represented to scale.
Figure 2:
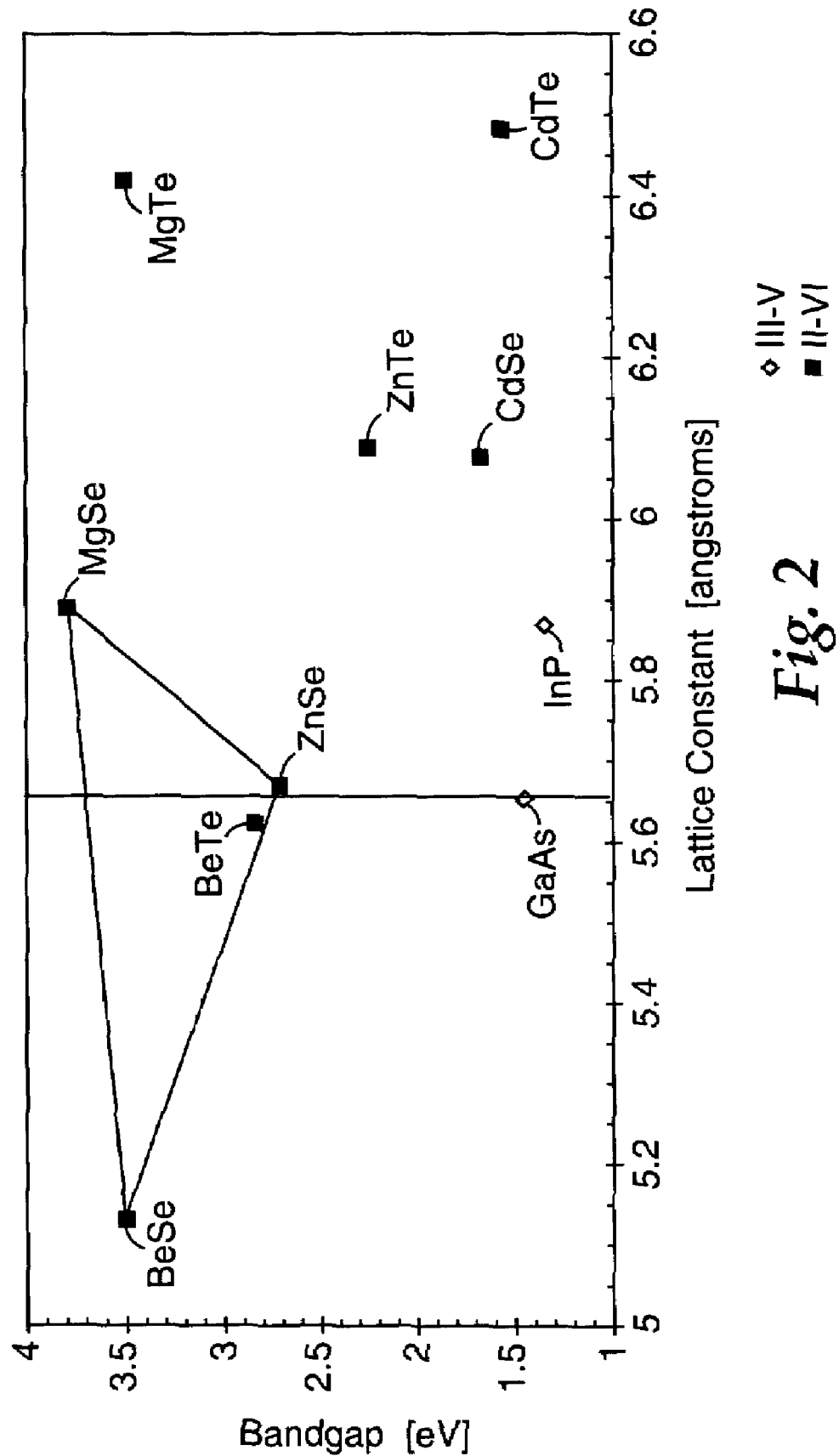
FIG. 2 is a graph indicating lattice constant and band gap energy for a variety of II-VI binary compounds and alloys thereof.

The present invention provides an LED comprising two or more Type II interfaces wherein at least two of the Type II interfaces differ in transition energy by at least 5%, or more typically by at least 10%, and wherein at least one of the Type II interfaces is within a pn junction. In an alternate embodiment, an LED is provided comprising two or more light-emitting Type II interfaces wherein at least two of the Type II interfaces differ in transition energy by at least 5%, or more typically by at least 10%. In one such embodiment, the Type II interfaces are located in a pn junction. In another such embodiment, the Type II interfaces are not located in a pn junction. In the later case, emission from the Type II interfaces may be photopumped by a nearby light source, such as an LED. In some embodiments of the LED according to the present invention, Type II interfaces may include interfaces with layers which are electron quantum wells and not hole quantum wells, interfaces with layers which are hole quantum wells and not an electron quantum wells, or interfaces that satisfy both conditions simultaneously.

The terms "Type I interface" and "Type II interface" represent particular structures where electrons are apt to recombine with holes in a semiconductor device. Type I and Type II interfaces occur at the junction between two different semiconductors or semiconductor alloys. Type I or Type II interfaces may occur at junctions between quantum wells and adjacent layers, but quantum wells are not necessary to form Type I or Type II interfaces.

A Type I interface is one where the conduction band energy of a first semiconductor is lower than that of an immediately adjoining second semiconductor and the valence band energy of the first semiconductor is higher than that of the second semiconductor. Electrons tend to collect in the first semiconductor due to of its lower conduction band energy, and holes tend to collect in the first semiconductor due to its higher valence band energy; thus electrons and holes are apt to recombine in the first semiconductor. A quantum well which is both an electron quantum well (lower conduction band energy than the surrounding semiconductor) and a hole quantum well (higher valence band energy than the surrounding semiconductor) represents a Type I interface.

A Type II interface is one where the conduction band energy of a first semiconductor is lower than that of an immediately adjoining second semiconductor and the valence band energy of the first semiconductor is also lower than that of the second semiconductor. Electrons tend to collect in the first semiconductor near the junction between the first and second semiconductors, and holes tend to collect in the second semiconductor near the same junction. Thus electrons and holes are apt to recombine across the junction. The first semiconductor, with its lower conduction band energy which is conducive to electron accumulation, would typically be on the n-region side of the device, and the second semiconductor, with its higher valence band energy which is conducive to hole accumulation, would typically be on the p-region side of the device. A Type II interface can exist at the junction between an electron quantum well (lower conduction band energy than the surrounding semiconductor) and surrounding semiconductor; or at the junction between a hole quantum well (higher valence band energy than the surrounding semiconductor) and surrounding semiconductor; or at the junction between an electron quantum well and a hole quantum well.

The semiconductor device according to the present invention may be composed of any suitable semiconductors, including Group IV elements such as Si or Ge (other than in light-emitting layers), III-v compounds such as InAs, AlAs, GaAs, InP, AlP, GaP, InSb, AlSb, GaSb, and alloys thereof, II-VI compounds such as ZnSe, CdSe, BeSe, MgSe, ZnTe, CdTe, BeTe, MgTe, ZnS, CdS, BeS, MgS and alloys thereof, or alloys of any of the above. Where appropriate, the semiconductors may be n-doped or p-doped by any suitable method or by inclusion of any suitable dopant.

The semiconductor device according to the present invention may include a substrate. Any suitable substrate may be used in the practice of the present invention. Typical substrate materials include Si, Ge, GaAs, InP, sapphire, SiC and ZnSe. Most typically, the substrate is GaAs. The substrate may be n-doped, p-doped, or semi-insulating, which may be achieved by any suitable method or by inclusion of any suitable dopant. Alternately, the semiconductor device according to the present invention may be without a substrate. In one embodiment, the semiconductor device according to the present invention may be formed on a substrate and then separated from the substrate.

In one embodiment of the present invention, the compositions of the various layers of the semiconductor device are selected in light of the following considerations. Each layer typically will be pseudomorphic to the substrate at the thickness given for that layer or lattice matched to the substrate. Alternately, each layer may be pseudomorphic or lattice matched to immediately adjacent layers. Quantum well layer materials and thicknesses are typically chosen so as to provide a Type II interface between immediately adjacent layers, which will correspond to the wavelength of light to be emitted from the interface. The thickness of each quantum well layer will determine the amount of quantization energy in the quantum well, which increases the transition energy at the Type II interface. Typically thicknesses for quantum well layers are between 1 nm and 100 nm, more typically between 2 nm and 35 nm. Typically the quantization energy translates into a reduction in wavelength of 20 to 50 nm relative to that expected on the basis of the band gap energy alone. Strain in the emitting layers may also change the transition energy, including the strain resulting from the imperfect match of lattice constants between pseudomorphic layers. Since the transition energy for a Type II interface is the difference between a conduction band energy of one layer and a valence band energy of an adjacent layer, the transition energy can be tuned by adjustment of the quantum well layer thickness and alloy composition of the adjacent layers. The materials which comprise the additional n-doped, p-doped or undoped (intrinsic) layers of the semiconductor device that do not comprise the quantum wells, including layers which make up the pn junction, typically are chosen to be transparent to the light generated by the LED. The thickness of these additional layers is typically much greater than that for the quantum wells, typically at least 50 nm and up to 100 μm.

Techniques for calculating the transition energy of a strained or unstrained potential well or quantum well are known in the art, e.g., in Herbert Kroemer, *Quantum Mechanics for Engineering, Materials Science and Applied Physics* (Prentice Hall, Englewood Cliffs, N.J., 1994) at pp. 54-63; and Zory, ed., *Quantum Well Lasers* (Academic Press, San Diego, Calif., 1993) at pp. 72-79; both incorporated herein by reference.

Any suitable emission wavelengths may be chosen, including those in the infrared, visible, and ultraviolet bands. In one embodiment of the present invention, the emission wavelengths are chosen so that the combined output of light emitted by the device creates the appearance of any color that can be generated by the combination of two, three or more monochromatic light sources, including white or near-white colors, pastel colors, magenta, cyan, and the like. In another embodiment, the LED according to the present invention emits light at an invisible infrared or ultraviolet wavelength and at a visible wavelength as an indication that the device is in operation.

FIG. 1 is a band diagram representing conduction and valence bands of semiconductors in a construction according to one embodiment of the present invention. Conduction and valence band energies are shown as altered by application of a voltage across the construction such that the device is biased beyond the "flat band" condition. In one embodiment of the present invention, a typical operating voltage is 3 V. Electron and hole energy levels in the quantum wells are also shown, demonstrating the quantization effects. Layer thickness is not represented to scale. Table I indicates the composition of layers 1-6 in this embodiment and the band gap energy ($E_g$) for that composition.

TABLE I

| Layer | Composition | Band gap Energy ($E_g$) |
|---|---|---|
| 1 | ZnSe | 2.7 eV |
| 2 | BeTe | 2.8 eV |
| 3 | $Be_{0.08}Mg_{0.12}Zn_{0.8}Se$ | 2.9 eV |
| 4 | BeTe | 2.8 eV |
| 5 | $Be_{0.17}Mg_{0.33}Zn_{0.5}Se$ | 3.2 eV |
| 6 | BeTe | 2.8 eV |

Layers 2-5 are each sufficiently thin that quantum size effects increase the electron-hole pair transition energy, and therefore the emitted photon energy. Layers 3 and 5 represent layers which are electron quantum wells and not hole quantum wells. Layers 2 and 4 represent layers which are hole quantum wells and not electron quantum wells. A, B and C represent Type II transitions across Type II interfaces, which are tuned by layer thickness and alloy composition to emit photons at red, green and blue wavelengths, respectively. Electrons tunnel from layer 1 through layers 2 and 4 to reach layers 3 and 5. Holes tunnel from layer 6 through layers 5 and 3 to reach layers 4 and 2. The composition and thickness of each layer is chosen in consideration of the desired emission wavelengths. In addition, an appropriate balance of emission from interfaces A, B and C is achieved by balancing the tunneling rates vs. recombination rates in each layer, again by selection of layer composition and thickness.

In one embodiment of the present invention, layers 1-6 are within a pn junction, not shown, with layer 6 oriented toward the p-region and layer 1 toward the n-region. To be more specific, the pn junction is typically a pin junction, since intermediate undoped ("intrinsic" doping) layers are interposed between n-doped and p-doped layers. Electrical contacts, not shown, provide a path for supply of electrical current to the pn junction. Electrical contacts conduct electricity and typically are composed of conductive metal.

In another embodiment of the present invention, layers 1-6 are not within a pn junction, but are instead photopumped by a nearby light source, typically an LED. Most typically, the LED is part of the same construction. Typically, the LED emits light at a shorter wavelength than any of the transition energies of the Type II interfaces, most typically at green, blue or violet wavelengths. In this embodiment additional absorbing layers may be added to absorb photons emitted from the nearby light source. The absorbing layers are immediately adjacent or closely adjacent to layers which form a Type II interface. The absorbing layers typically have a band gap energy that is intermediate between the energy of the photons emitted from the nearby light source and the transition energies of the Type II interfaces. Electron-hole pairs generated by absorption of photons in the absorbing layers typical recombine with concomitant emission of a photon in the Type II interfaces. Additional relevant disclosure may be found in U.S. patent applicaion Ser. No. 11/009,241 filed on even date herewith, incorporated herein by reference.

The semiconductor device according to the present invention may comprise additional layers of conducting, semiconducting or non-conducting materials. Electrical contact layers may be added to provide a path for supply of electrical current to the pn junction of the LED. Electrical contact layers may be placed such that the current supplied to the pn junction passes also through quantum wells or Type II interfaces that are not in the pn junction, or such that the current does not pass through quantum wells or Type II interfaces that are not in the pn junction. Light filtering layers may be added to alter or correct the balance of light wavelengths in the light emitted by the device. To improve brightness and efficiency, layers comprising a mirror or reflector may be added behind the LED element, e.g., between the substrate and LED element, behind the substrate and LED element, within or comprising the substrate, or behind the LED after removal of the substrate.

The semiconductor device according to the present invention may comprise additional semiconductor elements comprising active or passive components such as resistors, diodes, zener diodes, conventional LED's, capacitors, transistors, bipolar transistors, FET transistors, MOSFET transistors, insulated gate bipolar transistors, phototransistors, photodetectors, SCR's, thyristors, triacs, voltage regulators, and other circuit elements. The semiconductor device according to the present invention may comprise an integrated circuit. The semiconductor device according to the present invention may comprise a display panel or an illumination panel.

The layered construction according to the present invention may be manufactured by any suitable method, which may include molecular beam epitaxy (MBE), chemical vapor deposition, liquid phase epitaxy and vapor phase epitaxy.

The semiconductor device according to the present invention may be a component or the critical component of a graphic display device such as a large- or small-screen video monitor, computer monitor or display, television, telephone device or telephone device display, personal digital assistant or personal digital assistant display, pager or pager display, calculator or calculator display, game or game display, toy or toy display, large or small appliance or large or small appliance display, automotive dashboard or automotive dashboard display, automotive interior or automotive interior display, marine dashboard or marine dashboard display, marine interior or marine interior display, aeronautic dashboard or aeronautic dashboard display, aeronautic interior or aeronautic interior display, traffic control device or traffic control device display, advertising display, advertising sign, or the like.

The semiconductor device according to the present invention may be a component or the critical component of a liquid crystal display (LCD), or like display, as a backlight to that display. In one embodiment, the semiconductor device according to the present invention is specially adapted for use a backlight for a liquid crystal display by matching the colors emitted by the semiconductor device according to the present invention to the color filters of the LCD display.

The semiconductor device according to the present invention may be a component or the critical component of an illumination device such as a free-standing or built-in lighting fixture or lamp, landscape or architectural illumination fixture, hand-held or vehicle-mounted lamp, automotive headlight or taillight, automotive interior illumination fixture, automotive or non-automotive signaling device, road illumination device, traffic control signaling device, marine lamp or signaling device or interior illumination fixture, aeronautic lamp or signaling device or interior illumination fixture, large or small appliance or large or small appliance lamp, or the like; or any device or component used as a source of infrared, visible, or ultraviolet radiation.

Various modifications and alterations of this invention will become apparent to those skilled in the art without departing from the scope and principles of this invention, and it should be understood that this invention is not to be unduly limited to the illustrative embodiments set forth hereinabove.

We claim:

1. An LED comprising two or more Type II interfaces wherein at least two of said two or more Type II interfaces differ in transition energy by at least 5% and wherein at least one of said two or more Type II interfaces is within a pn junction.

2. The LED according to claim 1 wherein at least two of said two or more Type II interfaces differ in transition energy by at least 10%.

3. The LED according to claim 1 wherein at least one of said two or more Type II interfaces is from a layer which is an electron quantum well and not a hole quantum well.

4. The LED according to claim 1 wherein at least one of said two or more Type II interfaces is to a layer which is a hole quantum well and not an electron quantum well.

5. The LED according to claim 1 wherein at least one of said two or more Type II interfaces is from a layer which is an electron quantum well and not a hole quantum well to a layer which is a hole quantum well and not an electron quantum well.

6. The LED according to claim 2 wherein at least one of said two or more Type II interfaces is from a layer which is an electron quantum well and not a hole quantum well.

7. The LED according to claim 2 wherein at least one of said two or more Type II interfaces is to a layer which is a hole quantum well and not an electron quantum well.

8. The LED according to claim 2 wherein at least one of said two or more Type II interfaces is from a layer which is an electron quantum well and not a hole quantum well to a layer which is a hole quantum well and not an electron quantum well.

9. The LED according to claim 1 wherein a first Type II interface of said two or more Type II interfaces has a first transition energy corresponding to yellow, green, blue or violet wavelength visible light, and wherein a second Type II interface of said two or more Type II interfaces has a second transition energy corresponding to red, orange or yellow wavelength visible light.

10. The LED according to claim 5 wherein a first Type II interface of said two or more Type II interfaces has a first transition energy corresponding to yellow, green, blue or violet wavelength visible light, and wherein a second Type II interface of said two or more Type II interfaces has a second transition energy corresponding to red, orange or yellow wavelength visible light.

11. The LED according to claim 8 wherein a first Type II interface of said two or more Type II interfaces has a first transition energy corresponding to yellow, green, blue or violet wavelength visible light, and wherein a second Type II interface of said two or more Type II interfaces has a second transition energy corresponding to red, orange or yellow wavelength visible light.

12. A graphic display device comprising the LED according to claim 1.

13. An illumination device comprising the LED according to claim 1.

14. A graphic display device comprising the LED according to claim 5.

15. An illumination device comprising the LED according to claim 5.

16. A graphic display device comprising the LED according to claim 8.

17. An illumination device comprising the LED according to claim 8.

18. An LED comprising two or more light-emitting Type II interfaces wherein at least two of said two or more Type II interfaces differ in transition energy by at least 5%.

19. The LED according to claim 18 wherein at least two of said two or more Type II interfaces differ in transition energy by at least 10%.

20. The LED according to claim 18 wherein at least one of said two or more Type II interfaces is from a layer which is an electron quantum well and not a hole quantum well.

21. The LED according to claim 18 wherein at least one of said two or more Type II interfaces is to a layer which is a hole quantum well and not an electron quantum well.

22. The LED according to claim 18 wherein at least one of said two or more Type II interfaces is from a layer which is an electron quantum well and not a hole quantum well to a layer which is a hole quantum well and not an electron quantum well.

23. The LED according to claim 19 wherein at least one of said two or more Type II interfaces is from a layer which is an electron quantum well and not a hole quantum well.

24. The LED according to claim 19 wherein at least one of said two or more Type II interfaces is to a layer which is a hole quantum well and not an electron quantum well.

25. The LED according to claim 19 wherein at least one of said two or more Type II interfaces is from a layer which is an electron quantum well and not a hole quantum well to a layer which is a hole quantum well and not an electron quantum well.

26. The LED according to claim 18 additionally comprising an LED capable of emitting green, blue or violet wavelength visible light, wherein a first Type II interface of said two or more Type II interfaces has a first transition energy corresponding to orange, yellow or green wavelength visible light, and wherein a second Type II interface of said two or more Type II interfaces has a second transition energy corresponding to red, orange or yellow wavelength visible light.

27. The LED according to claim 22 additionally comprising an LED capable of emitting green, blue or violet wavelength visible light, wherein a first Type II interface of said two or more Type II interfaces has a first transition energy corresponding to orange, yellow or green wavelength visible light, and wherein a second Type II interface of said two or more Type II interfaces has a second transition energy corresponding to red, orange or yellow wavelength visible light.

28. The LED according to claim 25 additionally comprising an LED capable of emitting green, blue or violet wavelength visible light, wherein a first Type II interface of said two or more Type II interfaces has a first transition energy corresponding to orange, yellow or green wavelength visible light, and wherein a second Type II interface of said two or more Type II interfaces has a second transition energy corresponding to red, orange or yellow wavelength visible light.

29. A graphic display device comprising the LED according to claim 18.

30. An illumination device comprising the LED according to claim 18.

31. A graphic display device comprising the LED according to claim 22.

32. An illumination device comprising the LED according to claim 22.

33. A graphic display device comprising the LED according to claim 25.

34. An illumination device comprising the LED according to claim 25.

35. A liquid crystal display comprising the LED according to claim 18.

36. A liquid crystal display comprising the LED according to claim 26, wherein said LED and said first and second transition energies are matched to the color filters of the liquid crystal display.

* * * * *

UNITED STATES PATENT AND TRADEMARK OFFICE
CERTIFICATE OF CORRECTION

| | | |
|---|---|---|
| PATENT NO. | : 7,719,015 B2 | Page 1 of 1 |
| APPLICATION NO. | : 11/009218 | |
| DATED | : May 18, 2010 | |
| INVENTOR(S) | : Thomas James Miller et al. | |

It is certified that error appears in the above-identified patent and that said Letters Patent is hereby corrected as shown below:

Column 3,

Line 4, Delete "0.01%" and insert -- 0.1% --, therefor.

Column 4,

Line 36, Delete "III-v" and insert -- III-V --, therefor.

Line 37, Delete "AIP," and insert -- AlP, --, therefor.

Column 6,

Line 40, Delete "applicaion Ser. No. 11/009,241" and insert -- application Ser. No. 11/009,241 [Atty Docket No. 60253US002] --, therefor.

Signed and Sealed this
Fifteenth Day of February, 2011

David J. Kappos
*Director of the United States Patent and Trademark Office*